(12) United States Patent
De Samber et al.

(10) Patent No.: US 6,177,295 B1
(45) Date of Patent: Jan. 23, 2001

(54) METHOD OF MANUFACTURING SEMICONDUCTOR DEVICES WITH "CHIP SIZE PACKAGE"

(75) Inventors: Mark A. De Samber; Henricus G. R. Maas, both of Eindhoven (NL)

(73) Assignee: U.S. Philips Corporation, New York, NY (US)

( * ) Notice: Under 35 U.S.C. 154(b), the term of this patent shall be extended for 0 days.

(21) Appl. No.: 09/268,259

(22) Filed: Mar. 15, 1999

(30) Foreign Application Priority Data

Mar. 16, 1998 (EP) .................................. 98200821

(51) Int. Cl.⁷ .................................. H01L 21/44
(52) U.S. Cl. ........................... 438/106; 438/458
(58) Field of Search .................. 438/51, 55, 64, 438/106, 110, 113, 114, 458–465; 257/678, 684, 700

(56) References Cited

U.S. PATENT DOCUMENTS 5,677,562 * 10/1997 Korwin-Pawlowski et al. .... 438/762

FOREIGN PATENT DOCUMENTS 9519645    7/1995   (WO) .

* cited by examiner

Primary Examiner—David Nelms
Assistant Examiner—Dung A Le
(74) Attorney, Agent, or Firm—Steven R. Biren

(57) ABSTRACT

A method of manufacturing enveloped semiconductor devices, in which use is made of a slice of a semiconductor material which is provided on its first side with an intermediate layer of an insulating material on which a top layer of a semiconductor material is formed, semiconductor elements are formed in the top layer, paths of the slice's surface situated on this side being left clear between the semiconductor elements, and the top layer is removed from the insulating intermediate layer at the location of the free paths. A metallization with connection electrodes extending as far as the free paths are formed on the first side of the slice, the slice is glued with its first side onto a transparent insulating supporting body, semiconductor material is removed from the second side of the slice facing away from the first side, and the slice thus reduced in thickness is provided on its second side with a layer of an insulating material. Grooves are formed in the supporting body, at the location of the free paths, which grooves intersect the connection electrodes of the metallization and extend into the layer of insulating material provided on the second side of the slice, conductor tracks are formed on the supporting body, which extend in the grooves so as to make contact with the connection electrodes intersected in the grooves, and the slice is divided, along the grooves, into separate semiconductor devices enveloped by the supporting body and the insulating layer provided on the second side.

5 Claims, 5 Drawing Sheets

METHOD OF MANUFACTURING SEMICONDUCTOR DEVICES WITH "CHIP SIZE PACKAGE"

BACKGROUND OF THE INVENTION

The invention relates to a method of manufacturing enveloped semiconductor devices, in which:
- semiconductor elements are formed on a first side of a slice of a semiconductor material, paths of the slice's surface situated on this side being left clear between the semiconductor elements,
- a metallization with connection electrodes extending as far as the free paths are formed on the first side of the slice,
- the slice is glued with its first side onto a transparent insulating supporting body,
- semiconductor material is removed from the second side of the slice facing away from the first side,
- the slice thus reduced in thickness is provided on its second side with a layer of an insulating material,
- grooves are formed in the supporting body, at the location of the free paths, which grooves intersect the connection electrodes of the metallization and extend into the layer of insulating material provided on the second side of the slice, —conductor tracks are formed on the supporting body, which extend in the grooves so as to make contact with the connection electrodes intersected in the grooves, and
- the slice is divided, along the grooves, into separate semiconductor devices enveloped by the supporting body and the insulating layer provided on the second side.

The enveloped semiconductor device may be extremely thin. After removal of semiconductor material from the second side of the slice, which has a customary thickness of, for example, approximately 600 $\mu$m, only a part hereof remains which has a thickness, for example, below 100 $\mu$m. The supporting body may also be very thin, i.e. it has a thickness of, for example, 100 $\mu$m. Also the layer of insulating material which is provided on the second side may be very thin. The conductor tracks formed on the supporting body may be provided with solder surfaces which enable the semiconductor devices to be mounted in a simple manner on a substrate containing wiring. Also these solder surfaces may be embodied so as to be very thin. An overall thickness of the enveloped semiconductor of approximately 300 $\mu$m is feasible. The dimensions of the enveloped semiconductor devices in the lateral direction are hardly larger than the lateral dimensions of the semiconductor elements formed in semiconductor material, which are also referred to as chips. The above-described envelope, also referred to as "Chip Size Package" may comprise, for example, integrated circuits with a memory. By virtue of their small thickness and lateral dimensions, semiconductor devices including such integrated circuits can suitably be used, for example, in credit cards and telephone cards.

In WO 95/19645, a description is given of a method of the type mentioned in the opening paragraph, in which use is made of a customary slice of semiconductor material. After the semiconductor elements and the metallization with connection electrodes are formed on the first side of the slice of semiconductor material and the slice is glued with its first side onto the supporting body, material is removed from the second side until the thickness of the slice is approximately 100 $\mu$m. Said slice is provided with grooves, which are also formed from the second side of the slice, within which the semiconductor material is entirely removed. These grooves are formed at the location of the free paths on the surface of the first side of the slice. Subsequently, a glass plate is glued onto the second side. In this process, the grooves in the second side are filled with the insulating material of the adhesive.

The grooves formed in the second side of the slice of semiconductor material must be aligned relative to the free paths on the surface of the first side of the slice. This cannot be readily achieved.

The grooves which are subsequently formed, in the supporting body, from the first side must be formed so as to intersect the connection electrodes without intersecting the semiconductor material of the slice which has been made thinner. In this case, the conductor tracks formed in the grooves will not be short-circuited by semiconductor material which, in practice, is doped and hence will exhibit a certain conductivity. Consequently, the grooves which are formed in the supporting body, from the first side, must be accurately aligned relative to the grooves already formed in the second side of the slice. This aligning operation too cannot be readily performed.

It is an object of the invention to provide a method in which the above aligning problems are reduced.

To achieve this, the method in accordance with the invention is characterized in that
- use is made of a slice of a semiconductor material which is provided on its first side with an intermediate layer of an insulating material on which a top layer of a semiconductor material is formed,
- the semiconductor elements are formed in this top layer,
- prior to the formation of the metallization on the first side of the slice, the top layer is removed from the insulating layer at the location of the free paths, and
- by removing semiconductor material from the second side, the layer of an insulating material situated below the top layer is exposed.

The invention is based on the realization that if use is made of a slice of a semiconductor material which is provided on its first side with an intermediate layer of an insulating material on which a top layer of a semiconductor material is formed, also referred to as Silicon-On-Insulator or SOI slice, the necessary alignment of a number of process steps relative to each other can be carried out from this first side of the slice.

The semiconductor elements are formed on the first side, the metallization with the contact electrodes is formed on the first side, and the grooves in the supporting body, which is transparent, are formed in the first side. The semiconductor material is removed in two steps from the free paths on the surface of the slice. In the first step, alignment is required, while this is not necessary in the second step. In the first step, the top layer is removed from the free paths on the surface of the first side. In the second step, which is carried out from the second side, the semiconductor material situated on the intermediate layer of an insulating material located below the top layer is entirely removed. This takes place throughout the surface of the slice, so that this process does not require aligning.

The layer of an insulating material on the second side of the slice can be applied by providing the second side, after the removal of the semiconductor material from the intermediate layer of an insulating material situated below the top layer, with a glass plate which is glued onto the exposed intermediate layer. Since the intermediate layer of insulating material is exposed after the removal of semiconductor material, the second side exhibits a flat surface. In addition, the second side of the slice is already passivated by the insulating intermediate layer. This is the reason why this second side of the slice is preferably provided with a layer of an insulating material in a different manner.

In a first embodiment, the slice is provided with its second side onto a sawing foil which is customarily used in the semiconductor technique. The grooves formed in the supporting body extend into this sawing foil. By virtue thereof, the division into separate semiconductor devices can be readily achieved by removing them from the sawing foil. Prior to the provision of the sawing foil, the second side may be provided, for example, with a layer of silicon nitride by means of a customary plasma deposition process.

In a second embodiment, a customary epoxy layer is deposited on the second side. On this layer, for example, the type number of the semiconductor device can be printed in a customary manner.

These and other aspects of the invention are apparent from and will be elucidated with reference to the embodiments described hereinafter.

DESCRIPTION OF THE PREFERRED EMBODIMENTS

Figure 1:
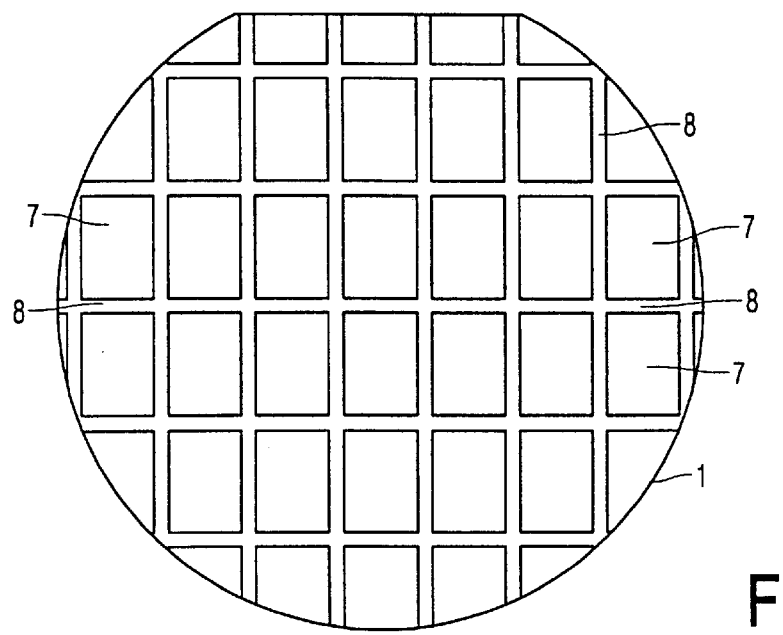
FIGS. 1 through 13 diagrammatically show several stages in the manufacture of a semiconductor device, using a first embodiment of the method in accordance with the invention.
Figure 2:
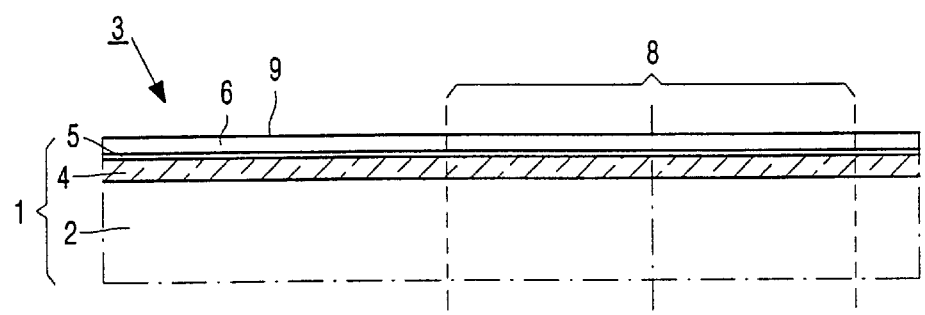

In the first embodiment of the method in accordance with the invention, use is made of a slice of a semiconductor material 1, in this example a slice of silicon 2 which is provided on its first side 3 with an intermediate layer 4 of an insulating material, here a layer of silicon oxide having a thickness of approximately 0.4 $\mu$m, on which a top layer 5, 6 of a semiconductor material is formed. In the example, the top layer 5, 6 comprises a layer of silicon 5 which is relatively heavily doped with approximately $10^{20}$ phosphor atoms per cc, said silicon layer having a thickness of approximately 0.1 $\mu$m, and an approximately 3 $\mu$m thick silicon layer 6 which is relatively lightly doped with approximately $10^{16}$ phosphor atoms per cc. The slice 1 comprising the silicon oxide intermediate layer 4 and the doped silicon layers 5 and 6 is for example obtained in a slice of silicon by forming the silicon oxide intermediate layer 4 by implantation of oxygen ions, doping the approximately 0.1 $\mu$m thick layer 5 situated above the silicon oxide intermediate layer 4 with phosphor in the above-mentioned concentration, and finally epitaxially growing the lightly doped layer 6 on the layer 5.

Semiconductor elements 7 are formed on the first side 3 of the slice 1, which is shown in plan view in FIG. 1. Between the semiconductor elements 7, paths 8 of the slice's surface 9 situated on the first side 3 are left clear. At the location of these free paths 8, also referred to as scribe paths, the finished semiconductor elements are separated from each other by sawing or breaking.

Figure 3:
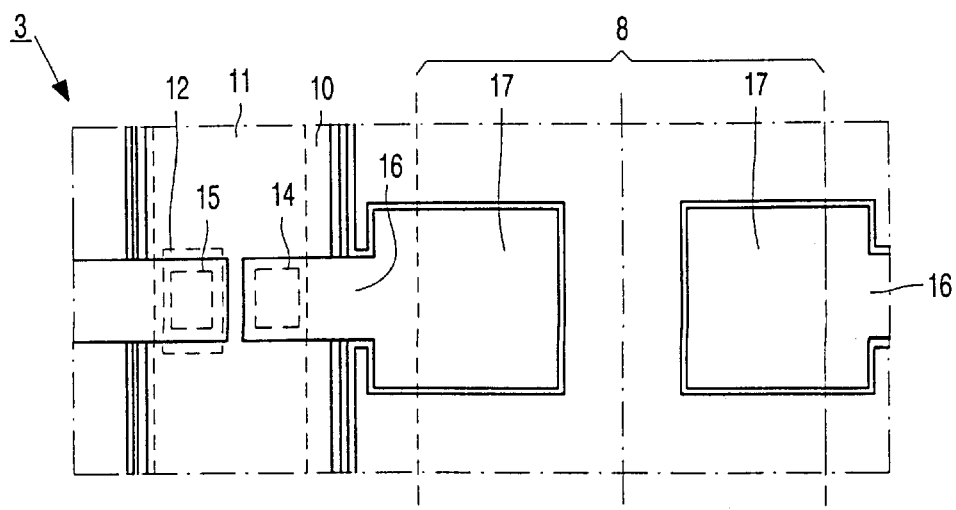
Figure 4:
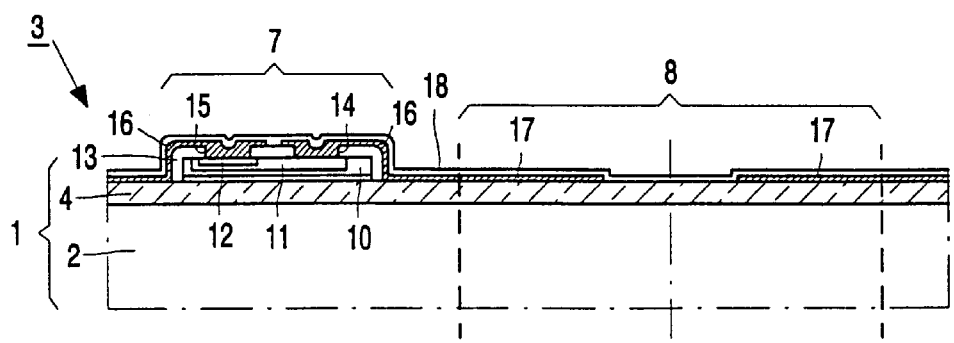

As shown in the sectional view of FIG. 4, and in the plan view of FIG. 3, an insulated island 10 is formed in the top layer 5, 6, which is achieved by removing a part of the layers 5 and 6 from the insulating intermediate layer 4. In the silicon island 10, the semiconductor element 7, in this example a bipolar transistor, is subsequently formed in a customary manner so as to have a base region 11 with a doping of approximately $5 \cdot 10^{17}$ boron atoms and an emitter region 12 with a doping of approximately $10^{20}$ arsenic atoms. Subsequently, the silicon island 10 is provided with a layer of silicon oxide 13 in which windows 14 and 15 are formed to contact, respectively, the base region 11 and the emitter region 12.

After the formation of the semiconductor element 7, a metallization 16 with contact electrodes 17 is formed in a deposited aluminium layer. The Figures are not drawn to scale; in practice, the conductor tracks 16, for example, have a width of approximately 1 to 10 $\mu$m, the contact electrodes 17, for example, have a length and a width of approximately 100 $\mu$m. The contact electrodes 17 extend as far as the free paths 8. In the Figures, contact electrodes 17 of neighboring semiconductor elements are shown in the free paths 8. Finally, an insulating layer 18 of silicon oxide is provided.

In the example, a single bipolar transistor is shown as the semiconductor element 7 for the sake of clarity. In practice, however, such a semiconductor element may be an integrated circuit including a large number of switching elements. They may be bipolar transistors but also, for example, MOS transistors. Apart from these active switching elements, also passive elements, such as coils, capacitors and light guides may be incorporated. These passive elements may be provided on the silicon top layer 5, 6, however, this top layer may alternatively be removed at the location of the passive elements, so that these passive elements are situated on the intermediate layer 4. The element 7 may alternatively include a number of integrated circuits which are separated from each other by a strip where the top layer 5, 6 is removed from the intermediate layer 4. This enables, for example, a digital and an analog block to be insulated from each other.

Figure 5:
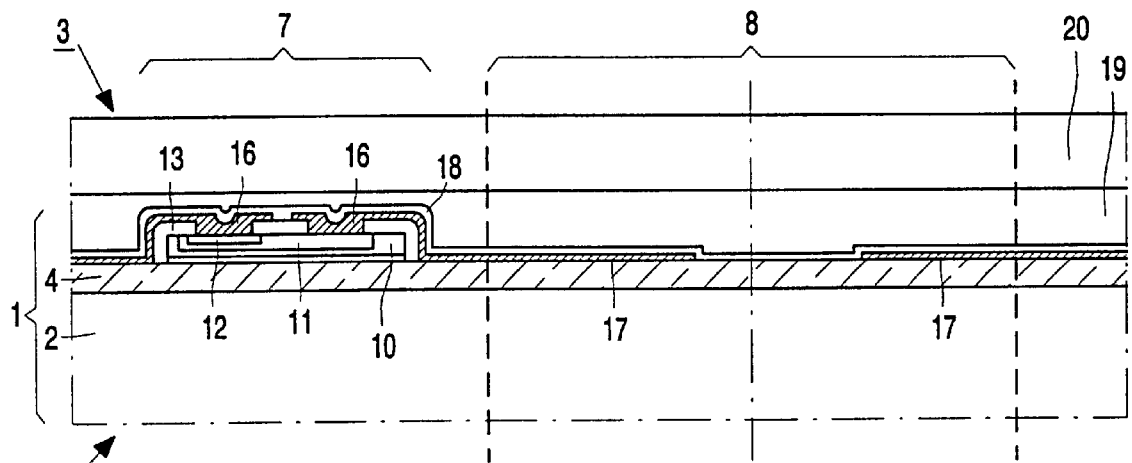

Subsequently, as shown in FIG. 5, an adhesive layer 19 is used to glue the slice 1 with its first side 2 onto an insulating supporting body 20. The adhesive is, for example, an epoxy or acrylate adhesive, and the supporting body 20 is, in this case, a glass plate having a thickness of 100 $\mu$m.

Subsequently, from the second side 21 facing away from the first side 3, semiconductor material is removed from the slice 1. This treatment is continued until the insulating intermediate layer 4 situated below the top layer 5, 6 is exposed. To this end, the second side 21 of the slice 1 is subjected to a chemico-mechanical polishing treatment until the distance to the insulating intermediate layer 4 is reduced to several tens of $\mu$m, whereafter the intermediate layer 4 is exposed in an etch bath of KOH. This etch treatment stops automatically when the insulating intermediate layer 4 of silicon oxide has been reached.

Figure 7:
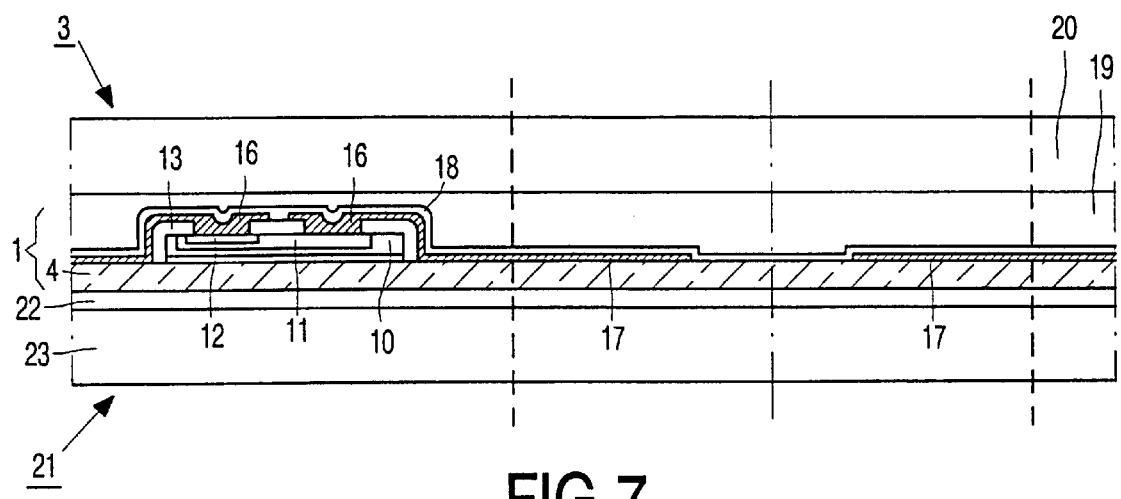

The slice 1 reduced in thickness as described above is subsequently, as shown in FIG. 7, provided on its second side 21 with a layer of an insulating material 22, 23. In this example, an adhesive layer 22 is used, in the same manner as described with respect to the first side 4, to glue a glass plate 23 onto the exposed intermediate layer 4.

Figure 8:
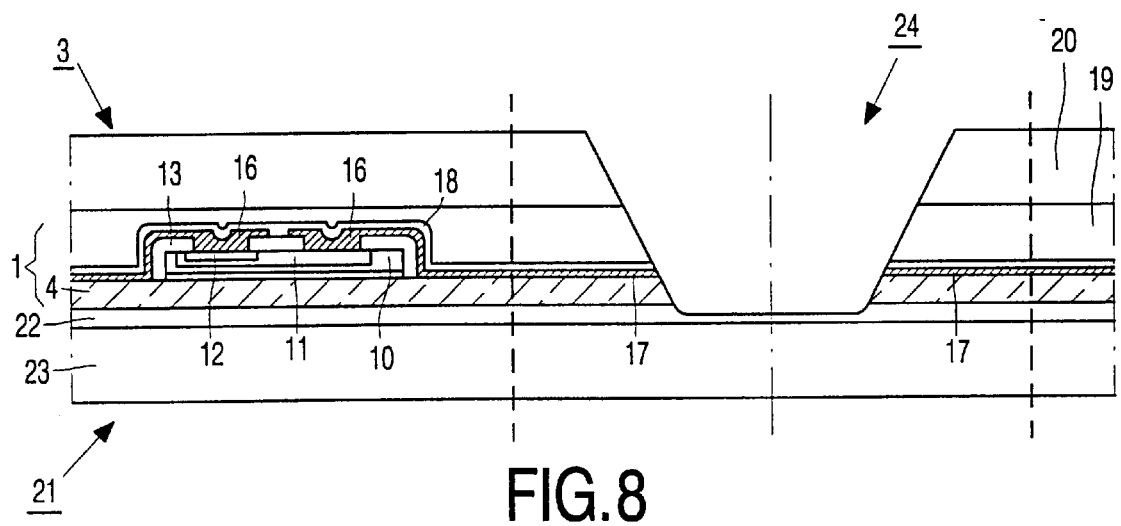

Subsequently, as shown in FIG. 8, grooves 24 are formed in the supporting body 20 at the location of the free paths 7, which grooves intersect the connection electrodes 17 of the metallization 16 and extend into the layer of insulating material 22, 23 provided on the second side of the slice.

Figure 9:
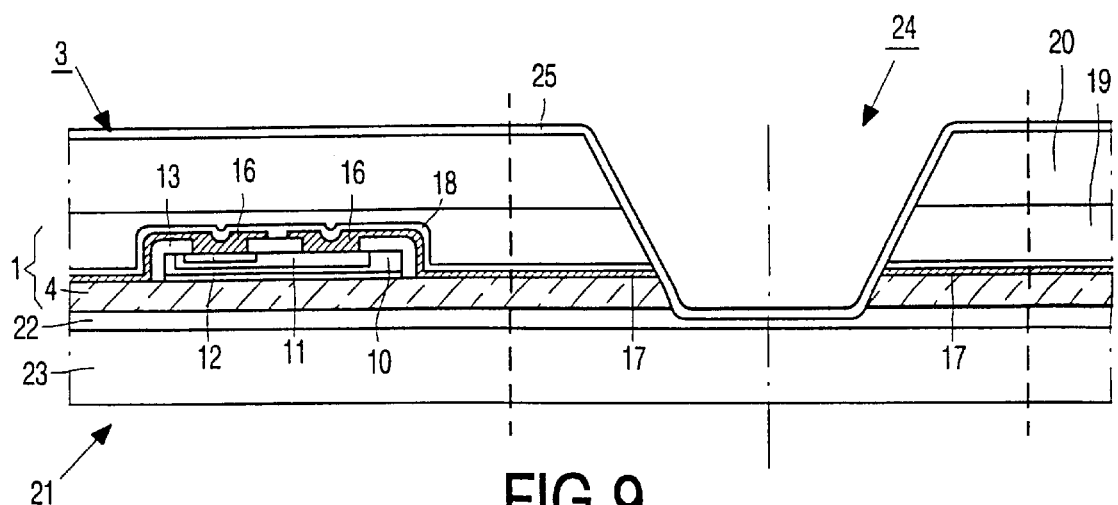
Figure 10:
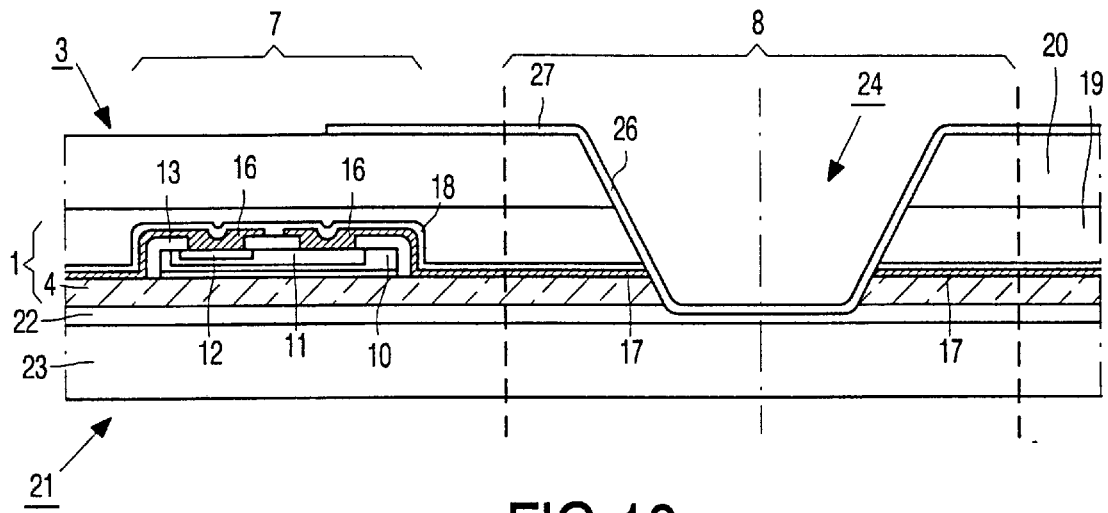
Figure 11:
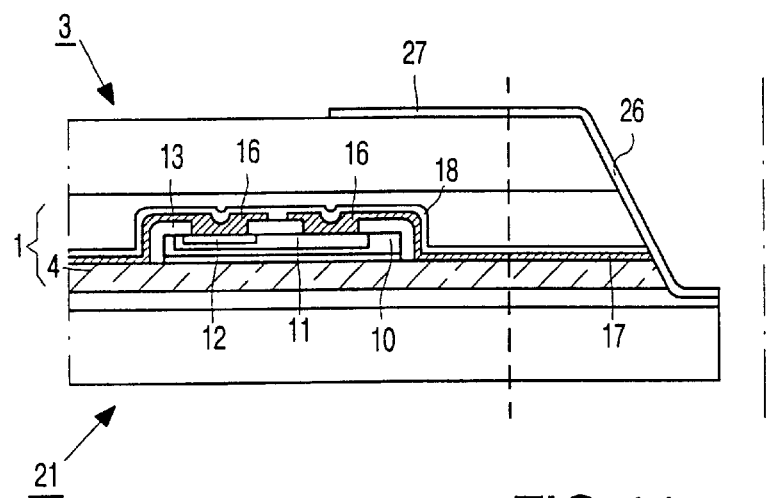

As shown in FIG. 9, after the formation of the grooves 24, a metal layer 25, in this example a multilayer consisting of a layer of Ti, a layer of Pt and a top layer of Au, is provided on the supporting body 20 and in the grooves 24. As shown in FIG. 10, conductor tracks 26 are formed in this metal layer 25, which extend in the grooves 24 where they contact the connection electrodes 17 intersected in the grooves.

Finally, the slice 1 is divided, for example by sawing right across the free paths 8, into individual semiconductor devices enveloped by the supporting body 20 and the insulating layer 22, 23 provided on the second side 21.

The semiconductor device thus enveloped is very thin. The slice 1 provided with the insulating layers 13, 18 and the metallization 16 has an overall thickness of approximately 5 μm. The adhesive layers 19 and 22 have a thickness of approximately 20 μm and the glass plates have a thickness of approximately 100 μm. As a result, the overall thickness of the semiconductor device is less than 250 μm. Also in the lateral direction, the semiconductor device is hardly larger than the semiconductor element 7. Furthermore, on the supporting body, the conductor tracks 26 are connected to solder surfaces 27 enabling the semiconductor device to be soldered onto a wiring provided on the surface of a printed circuit board. In this manner, a "device" in a "Chip Size Package" is obtained which can suitably be used for "surface mounting".

Figure 6:
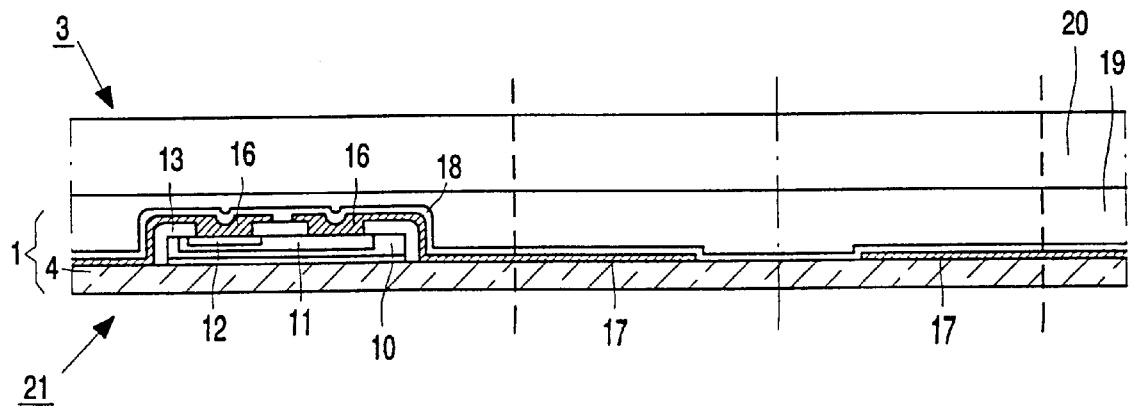

In the method, use is made of a slice of a semiconductor material 1 which is provided on its first side 3 with an intermediate layer 4 of an insulating material on which a top layer 5, 6 of a semiconductor material is formed, also referred to as Silicon-On-Insulator or SOI slice. By virtue thereof, the necessary alignment of a number of process steps relative to each other can be carried out from this first side 3 of the slice. As shown in FIG. 4, the semiconductor elements 7 are formed on the first side 3, the metallization 16 with the contact electrodes 17 is formed on the first side and the grooves 24 in the supporting body 20, which is made of glass and hence is transparent, are formed in the first side 3. The semiconductor material is removed from the free paths 8 on the surface 9 of the slice 1 in two steps. In the first step, alignment is required, while this is not necessary in the second step. In the first step, as shown in FIG. 4, the top layer 5, 6 is removed from the free paths 8 on the surface of the first side. This takes place from the first side 3. In the second step shown in FIG. 6, which is carried out from the second side 21, the semiconductor material is entirely removed from the intermediate layer 4 of insulating material situated below the top layer 5, 6. This occurs throughout the surface of the slice, so that this operation does not require aligning.

The layer of insulating material 22, 23 on the second side 21 of the slice 1 can be applied by providing the second side, after removing the semiconductor material from the intermediate layer of insulating material situated below the top layer, with a glass plate 23 which is glued onto the exposed intermediate layer. Since the intermediate layer 4 of insulating material is exposed after removal of the semiconductor material, the second side 21 exhibits a flat surface. In addition, the second side of the slice is already passivated by the insulating intermediate layer 4. For this reason, a different method is preferably used to provide this second side of the slice with a layer of an insulating material.

Figure 12:
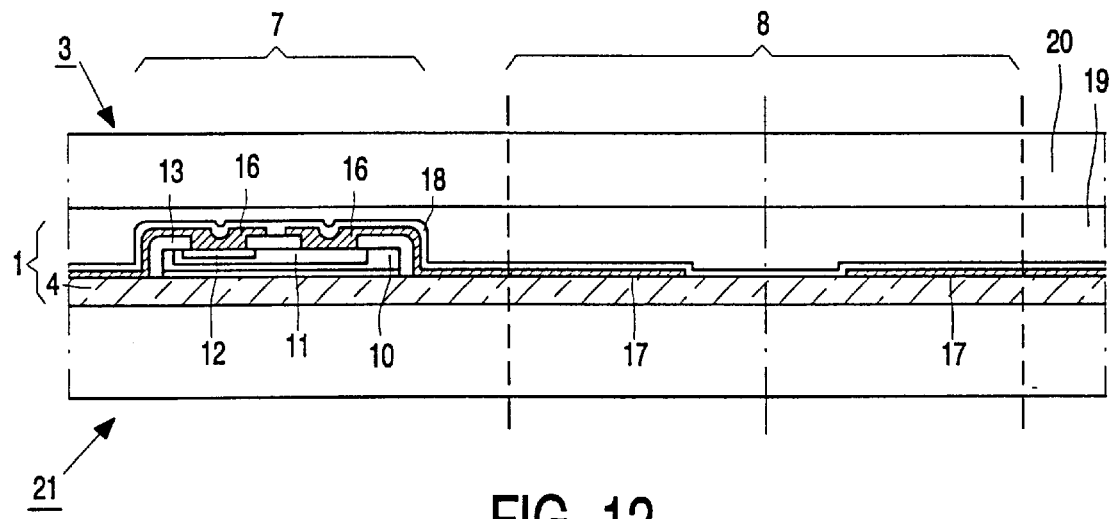

In a first embodiment, the slice is provided with its second side, as shown in FIG. 12, on a sawing foil 28 which is customarily used in the semiconductor technique.

Figure 13:
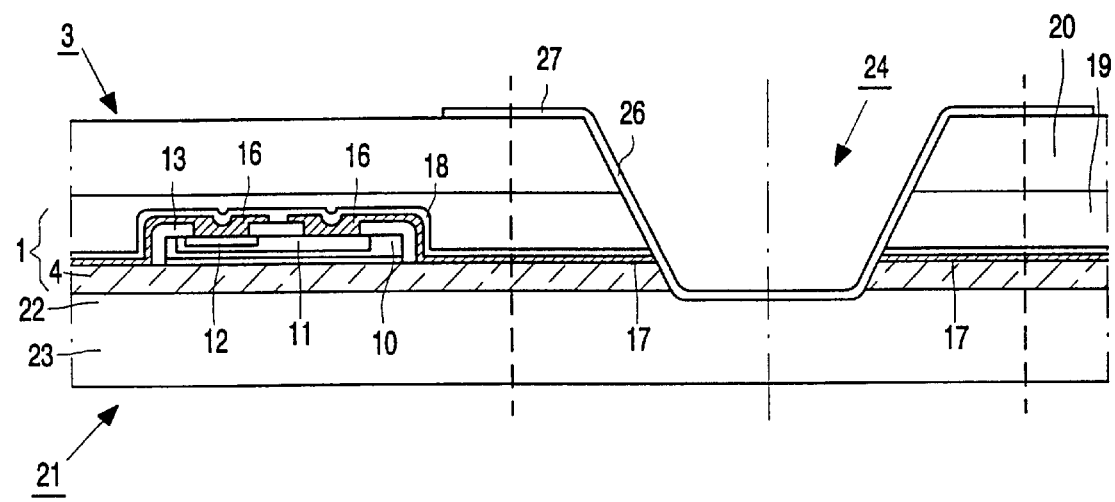

The grooves 24 formed in the supporting body extend into this sawing foil 28. This enables the division into separate semiconductor devices to be carried out in a simple manner by removing them from the sawing foil. FIG. 13 shows this embodiment after the groove 24 is formed and the conductor tracks 26 with solder surface 27 are provided. Prior to the provision of the sawing foil, the second side may for example be provided with a layer of silicon nitride, not shown, by means of a customary plasma deposition process.

In a second embodiment, not shown, a customary layer of epoxy is deposited on the second side. For example, the type number of the semiconductor device can be printed in a customary manner on this epoxy layer.

What is claimed is:

1. A method of manufacturing enveloped semiconductor devices, comprising:

forming semiconductor elements on a first side of a slice of a semiconductor material, paths of the slice's surface situated on this side being left clear between the semiconductor elements, forming a metallization with connection electrodes extending as far as the free paths on the first side of the slice, gluing the slice with its first side onto a transparent insulating supporting body, removing semiconductor material from the second side of the slice facing away from the first side, providing the slice thus reduced in thickness on its second side with a layer of an insulating material, forming grooves in the supporting body, at the location of the free paths, which grooves intersect the connection electrodes of the metallization and extend into the layer of insulating material provided on the second side of the slice, forming conductor tracks on the supporting body, which extend in the grooves so as to make contact with the connection electrodes intersected in the grooves, and dividing the slice, along the grooves, into separate semiconductor devices enveloped by the supporting body and the insulating layer provided on the second side, said method further comprising:

using a slice of a semiconductor material which is provided on its first side with an intermediate layer of an insulating material on which a top layer of a semiconductor material is formed, forming the semiconductor elements in this top layer, prior to the formation of the metallization on the first side of the slice, removing the top layer from the insulating intermediate layer at the location of the free paths, and by removing semiconductor material from the second side, exposing the layer of an insulating material situated below the top layer.

2. A method as claimed in claim 1, comprising, after removing, from the second side, the semiconductor material from the slice, securing said slice onto a sawing foil, and after forming the grooves in the supporting body, removing the semiconductor devices from the sawing foil.

3. A method as claimed in claim 2, comprising depositing a layer of silicon nitride on the exposed intermediate layer before the slice is secured to the sawing foil.

4. A method as claimed in claim 1, comprising depositing a layer of a synthetic resin on the exposed intermediate layer.

5. A method as claimed in claim 4, comprising depositing a layer of epoxy on the exposed intermediate layer.

\* \* \* \* \*